(12) United States Patent
Hong et al.

(10) Patent No.: US 11,194,413 B2
(45) Date of Patent: Dec. 7, 2021

(54) DISPLAY DEVICE FOR VEHICLE

(71) Applicants: Samsung Display Co., Ltd., Yongin-si (KR); Industry-Academic Cooperation Foundation, Yonsei University, Seoul (KR)

(72) Inventors: Jong Ho Hong, Yongin-si (KR); Da Young Ju, Incheon (KR); Keun Kyu Song, Yongin-si (KR); Jae Min Shin, Yongin-si (KR); Young Hoon Oh, Seoul (KR); Joon Hak Oh, Yongin-si (KR); Ji Min Ryu, Seoul (KR); So Yon Jeong, Incheon (KR); Hye Jin Joo, Yongin-si (KR); Ju Yeong Kwon, Incheon (KR)

(73) Assignees: Samsung Display Co., Ltd., Yongin-si (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 16/449,268

(22) Filed: Jun. 21, 2019

(65) Prior Publication Data
US 2020/0210003 A1 Jul. 2, 2020

(30) Foreign Application Priority Data

Dec. 28, 2018 (KR) .................. 10-2018-0172769

(51) Int. Cl.
*G06F 3/041* (2006.01)
*H01L 41/04* (2006.01)
(Continued)

(52) U.S. Cl.
CPC ............ *G06F 3/0412* (2013.01); *B60K 35/00* (2013.01); *B60R 11/0235* (2013.01);
(Continued)

(58) Field of Classification Search
CPC .................. G06F 3/0412; B60K 35/00; B60K 2370/1533; B60K 2370/1434; B60R 11/0235; B60R 2011/0007; H01L 41/04
See application file for complete search history.

(56) References Cited

U.S. PATENT DOCUMENTS 9,256,325 B2 2/2016 Lee
9,495,094 B2 11/2016 Kang et al.
(Continued)

FOREIGN PATENT DOCUMENTS

KR 10-1610092 B1 4/2016
KR 10-1768115 B1 8/2017
(Continued)

OTHER PUBLICATIONS

Noh, Eun Young, "Development of the Relation Model between Eye-Hand Coordination and Driving Workload: Focused on In-vehicle Interface." M.S. Dissertation, Department of Industrial Engineering, Sungkyunkwan University, Seoul, Korea, 2015, 117 pages.

*Primary Examiner* — Towfiq Elahi
(74) *Attorney, Agent, or Firm* — Lewis Roca Rothgerber Christie LLP

(57) ABSTRACT

A display device for a vehicle includes a stretchable display panel and a touch sensor on a first surface of the stretchable display panel and configured to sense a user's touch. The stretchable display panel includes a plurality of pixels and has a button display area and a display area adjacent the button display area. The stretchable display panel is integrally arranged on a center fascia of the vehicle that as a plurality of curved surfaces, and a step is defined between the button display area and the adjacent display area.

20 Claims, 13 Drawing Sheets

(51) Int. Cl.
  *B60R 11/02* (2006.01)
  *B60K 35/00* (2006.01)
  *B60R 11/00* (2006.01)

(52) U.S. Cl.
  CPC ...... *H01L 41/04* (2013.01); *B60K 2370/1434* (2019.05); *B60K 2370/1533* (2019.05); *B60R 2011/0007* (2013.01)

(56) References Cited

U.S. PATENT DOCUMENTS

| | | |
|---|---|---|
| 9,854,629 B2 | 12/2017 | Ikeda et al. |
| 10,086,702 B2 | 10/2018 | Kim et al. |
| 10,730,448 B2 * | 8/2020 | Amano ............... B60R 11/0235 |
| 2011/0261021 A1 * | 10/2011 | Modarres ............ H01L 41/0825 |
| | | 345/177 |
| 2014/0247405 A1 * | 9/2014 | Jin ........................... G09F 9/33 |
| | | 349/12 |
| 2015/0084886 A1 * | 3/2015 | Kamiyama ......... G06F 3/03548 |
| | | 345/173 |
| 2016/0193923 A1 * | 7/2016 | Kim ...................... B60K 37/06 |
| | | 296/70 |
| 2016/0209876 A1 * | 7/2016 | Park ...................... G06F 1/1652 |
| 2017/0322760 A1 * | 11/2017 | Soh ....................... G06F 3/1446 |
| 2019/0135199 A1 * | 5/2019 | Garcia ................. B60R 16/037 |
| 2019/0296097 A1 | 9/2019 | Hong et al. |

FOREIGN PATENT DOCUMENTS

| | | |
|---|---|---|
| KR | 10-1889838 B1 | 8/2018 |
| KR | 10-2019-0112880 A | 10/2019 |

\* cited by examiner

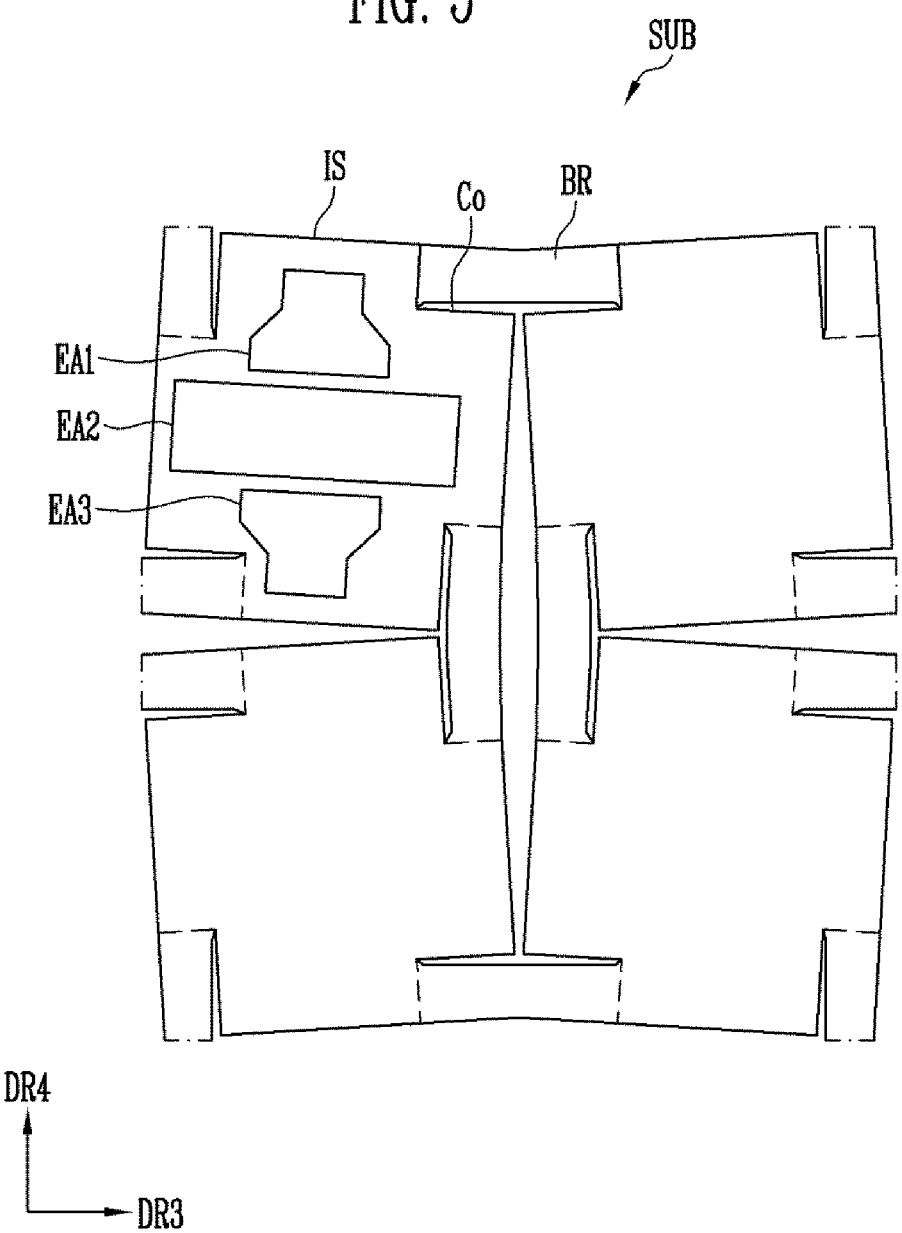

DISPLAY DEVICE FOR VEHICLE

CROSS-REFERENCE TO RELATED APPLICATION

This application claims priority to and the benefit of Korean patent application number 10-2018-0172769, filed on Dec. 28, 2018 in the Korean Intellectual Property Office (KIPO), the entire disclosure of which is incorporated herein by reference.

BACKGROUND

1. Field

Aspects of various embodiments of the present disclosure relate to a display device.

2. Description of Related Art

Flexible display devices are becoming more and more popular because they may be used as a display device for a mobile device, such as a smart phone, a tablet personal computer, an ultra slim notebook, a digital camera, a video camera, a personal digital assistant, or an electronic/electric product, such as an ultra-thin television.

Recently, a display device that is changeable into various shapes is being developed, and there is a growing demand to utilize such a display device in a variety of fields, including automotive, medical, and clothing fields.

With respect to display devices applied to the interior of a vehicle, research is being conducted into how to effectively display image information over a wider area and to facilitate the operation of the vehicle.

SUMMARY

Various embodiments of the present disclosure are directed to a display device for a vehicle that implements (or provides) a physical button effect by using a stretchable display panel.

The present disclosure should not be construed as limited to the above-described aspects and features. The present disclosure may be changed in various ways and embodied in various forms without departing from the spirit and/or scope of the present disclosure.

An embodiment of the present disclosure provides a display device for a vehicle. The display device includes a stretchable display panel and a touch sensor on a first surface of the stretchable display panel and configured to sense a user's touch. The stretchable display panel includes a plurality of pixels and has a button display area and a display area adjacent the button display area. The stretchable display panel is integrally arranged on a center fascia of the vehicle that as a plurality of curved surfaces, and a step is defined between the button display area and the adjacent display area.

A display surface of the button display area may protrude above a display surface of the adjacent display area.

A display surface of the button display area may be depressed below a display surface of the adjacent display area.

The button display area may have a first area that is depressed below the adjacent display area and a second area that protrudes above the adjacent display area.

The display device may further include a pressure sensor and a support member between the pressure sensor and the center fascia and supporting at least a portion of the stretchable display panel and the pressure sensor. The pressure sensor may be on a second surface of the stretchable display panel and may overlap the button display area, and the pressure sensor may be configured to detect a location at where pressure is applied and a magnitude of the applied pressure. The second surface may be opposite to the first surface.

The display device may further include a haptic actuator between the pressure sensor and the support member or between the pressure sensor and the stretchable display panel. The haptic actuator may be configured to vibrate in response to a change in a magnetic field.

The pressure sensor may include: a plurality of electrode layers stacked on each other in a vertical direction; and a plurality of piezoelectric layers between the electrode layers.

The display device may further include an insulator between the stretchable display panel and the pressure sensor.

The insulator may be on the second surface of the stretchable display panel and may extend to a periphery of the button display area.

The insulator may include an organic material configured to reduce friction between the stretchable display panel and the support member.

The display device may further include an insulator between the pressure sensor and the support member and covering the pressure sensor.

At least a portion of the insulator may contact the stretchable display panel at where the pressure sensor is not arranged.

The display device may further include: a pressure sensor on a second surface of the stretchable display panel and overlapping the button display area; a guide member supporting the pressure sensor and being configured to shrink or extend the stretchable display panel; and a support member between the center fascia and the adjacent display area of the button display area of the stretchable display panel and supporting the adjacent display area. The second surface may be opposite to the first surface;

The guide member may be configured to move in a vertical direction to shrink or extend the button display area of the stretchable display panel such that a step between the button display area of the stretchable display panel and the adjacent display area is changed.

The display device may further include an insulator between the stretchable display panel and the pressure sensor.

The stretchable display panel may include: a first display area on a front of the center fascia; a second display area extending from the center fascia towards a driver's seat; and a third display area extending from the center fascia towards a passenger seat.

The button display area may be on a portion of at least one of the first, second, and third display areas.

The stretchable display panel may further include a fourth display area on a lower control pad extending from the center fascia.

A planar portion of the button display area may have a circular shape.

The stretchable display panel may be configured to display audio-control information, air-conditioning-control information, and navigation information of the vehicle.

A display device for a vehicle according to embodiments of the present disclosure may use a stretchable display panel to provide an integrated large screen that fits the shape of a vehicle's center fascia. Furthermore, a three-dimensional button display for displaying information and controlling the vehicle may be provided by the stretchable display panel. Therefore, physical button(s), dial(s), and/or jog controller (s) may be omitted (or eliminated) from the center fascia, and the aesthetic effect of the vehicle's interior design can be improved. Furthermore, the convenience and stability of operating the vehicle may be enhanced while the vehicle is being driven by implementing the three-dimensional button display by using the stretchable display panel.

The shape of the button display area of the stretchable display panel may be controlled to fit a user's environment by moving a guide member, thereby improving a user's convenience when the display or the vehicle is controlled during driving.

Aspects and features of the present disclosure should not be construed as limited to the above-described aspects and features. The presented embodiments may be changed in various ways and the present disclosure may be embodied in various forms without departing from the spirit and scope of the present disclosure.

BRIEF DESCRIPTION OF THE DRAWINGS

FIG. 5 is a view of an example of a portion of a substrate included in the stretchable display panel of the display device for the vehicle shown in FIG. 1.

DETAILED DESCRIPTION

Figure 1:
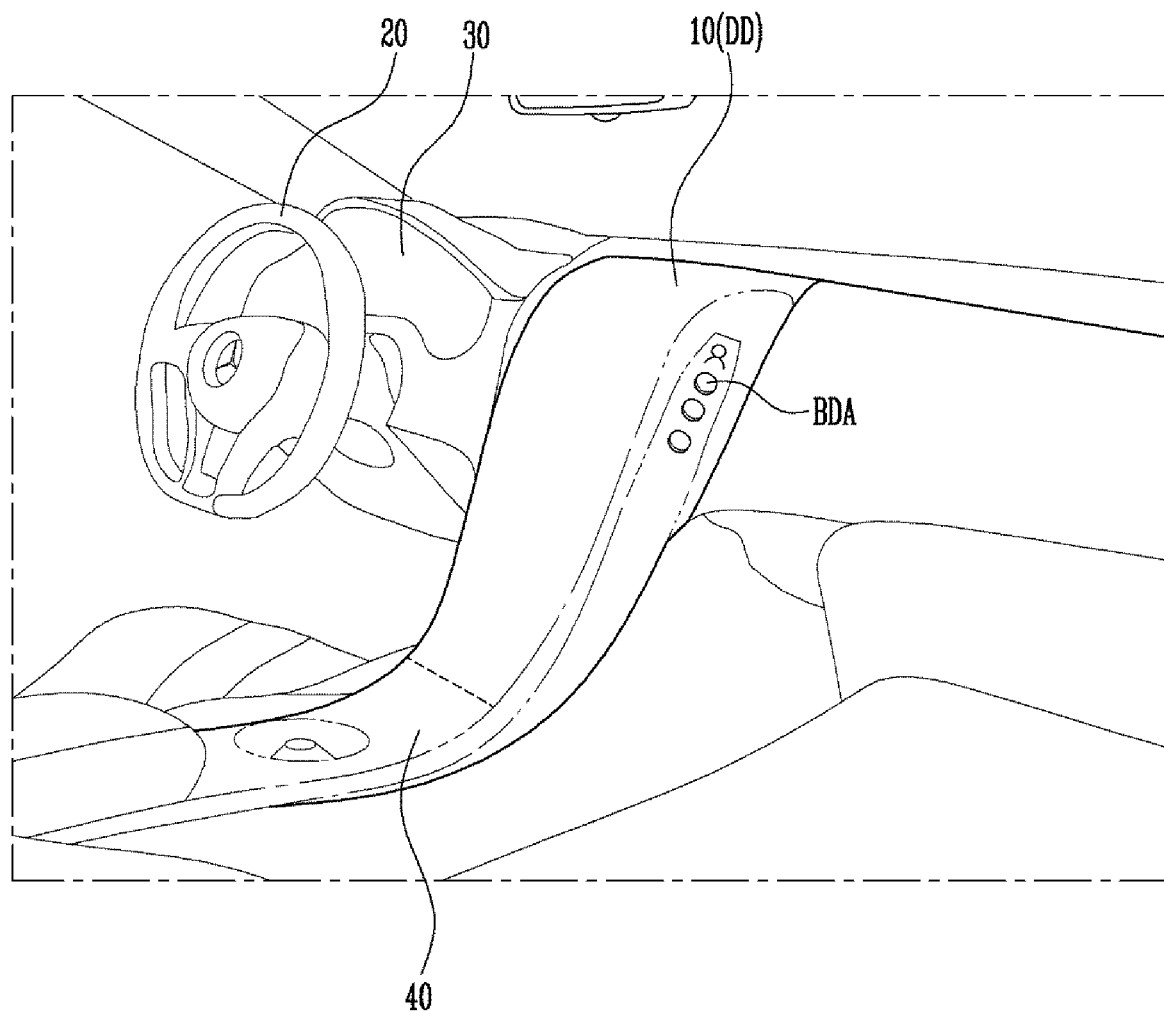
FIG. 1 is a view of a display device for a vehicle according to embodiments of the present disclosure.

Hereinafter, example embodiments of the present disclosure will be described in greater detail with reference to the accompanying drawings. Like reference numerals in the drawings denote like elements, and duplicate descriptions thereof may be omitted.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the term "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Figure 2A:
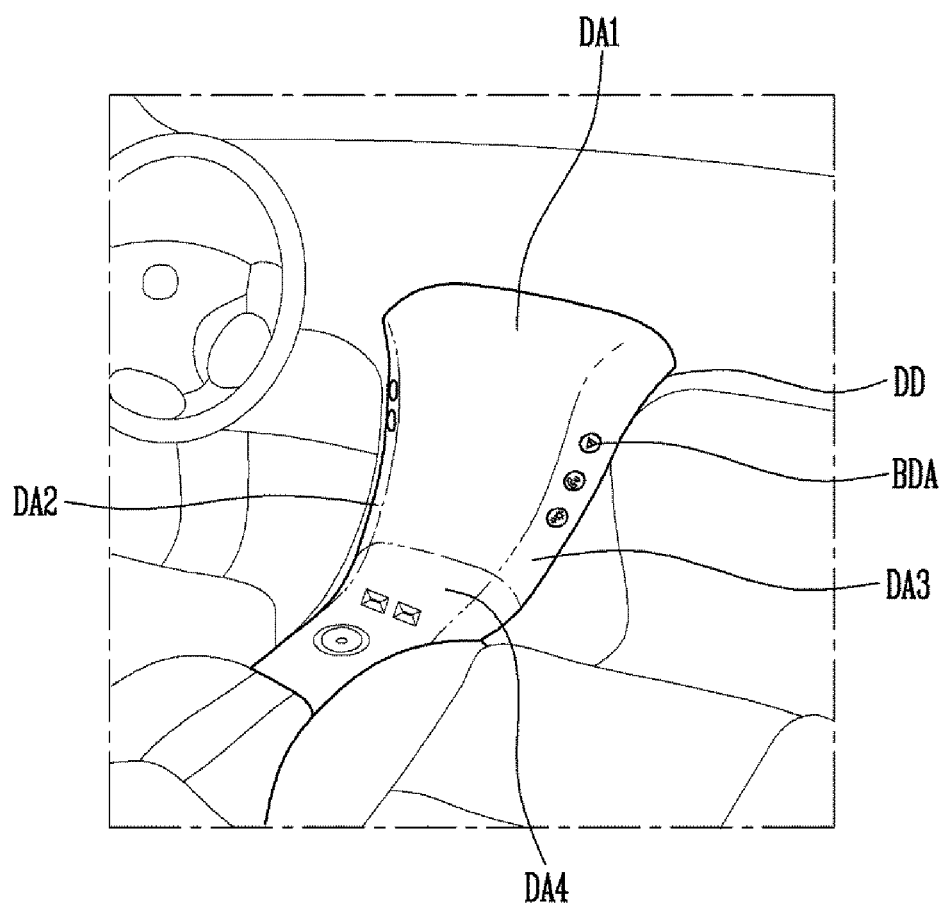
FIGS. 2A and 2B are views of examples of the display device for the vehicle shown in FIG. 1.
Figure 2B:
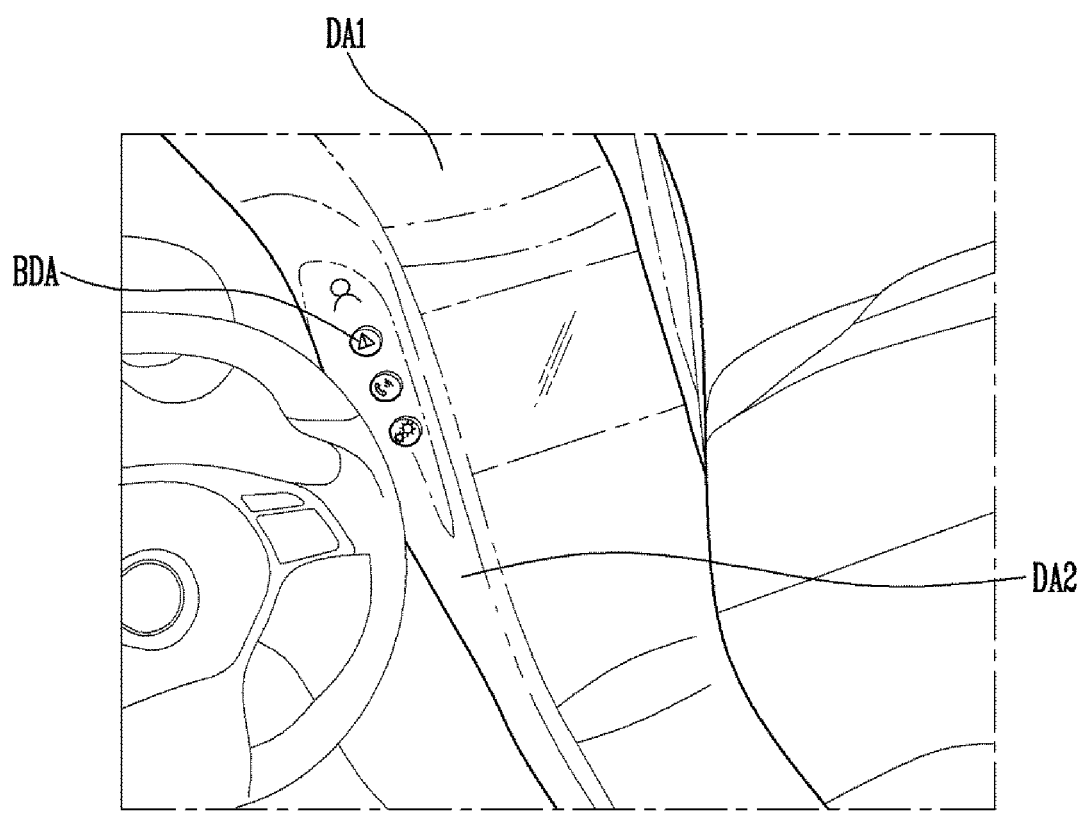
Figure 3:
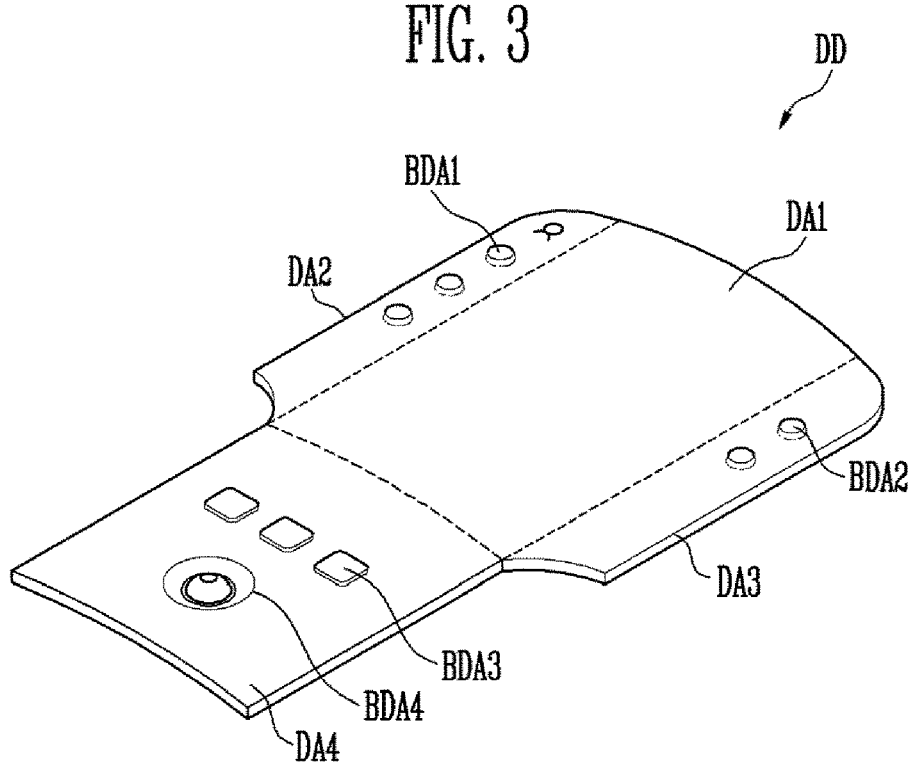
FIG. 3 is a developmental schematic view of an example of a stretchable display panel included in the display device for the vehicle shown in FIG. 1.

FIG. 1 is a view of a display device for a vehicle according to embodiments of the present disclosure, FIGS. 2A and 2B are views of examples of the display device for the vehicle shown in FIG. 1, and FIG. 3 is a developmental schematic view of an example of a stretchable display panel included in the display device for the vehicle shown in FIG. 1.

Referring to FIGS. 1-3, the display device DD for the vehicle may be formed on (e.g., may be arranged or placed on or over) a center fascia area 10 of the vehicle.

Generally, a dashboard is present in the vehicle to isolate a driver's seat (and a passenger seat) from an engine compartment. The dashboard may include the center fascia 10, a steering wheel 20, a cluster (e.g., a gauge cluster) 30, a lower control pad 40, etc. The interior of the vehicle and the configuration of the dashboard shown in FIG. 1 are merely illustrative, and the internal configuration of the vehicle is not limited thereto.

The center fascia 10 is a panel board that is located in a central portion of the dashboard between the driver's seat and the passenger seat. In some embodiments, an audio device, an air vent of an air conditioning system, etc. may be installed in the center fascia 10. The center fascia 10 does not have a planar shape. For example, the center fascia 10 may include a plurality of curved surfaces. The display device DD for the vehicle according to embodiments of the present disclosure may be integrally formed on the center fascia 10.

In an embodiment, the display device DD for the vehicle may extend integrally from the center fascia 10 to at least one of the cluster 30, the lower control pad 40, and the passenger seat (e.g., to an area adjacent the passenger seat).

The display device DD for the vehicle may include a stretchable display panel and a touch sensor.

The stretchable display panel includes a plurality of pixels and may be freely formed (or shaped) according to the shape of the center fascia 10. Thus, the stretchable display panel may have a streamlined shape to correspond to the shape of the center fascia 10 and may include a plurality of curved surfaces (e.g., curved-surface display areas).

In an embodiment, the stretchable display panel may include a first display area DA1 located on a front of the center fascia 10, a second display area DA2 located on a first side extending from the center fascia 10 towards the driver's seat, and a third display area DA3 located on a second side extending from the center fascia 10 towards the passenger seat. The stretchable display panel may further include a fourth display area DA4 extending from the center fascia 10 to the lower control pad 40.

The first to fourth display areas DA1-DA4 may be integrally formed (e.g., the first to fourth display areas DA1-DA4 may be sub-display areas of one continuous display area). For example, there may be no bezel between the first to fourth display areas DA1-DA4, and thereby, boundaries between the first to fourth display areas DA1-DA4 are not visible.

In an embodiment, the stretchable display panel may include a button display area BDA with a step (e.g., a step difference) defined between the button display area BDA and adjacent display areas. For example, the button display area BDA may be formed to be higher or lower than a periphery thereof (e.g., may be formed to be raised or sunken from a peripheral region). The button display area BDA is not a distinct physical button that is substantially separated from another display area. For example, the button display area BDA may be integrally formed with other surrounding display areas such that a continuous image may be displayed on the button display area BDA and its peripheral area(s). The button display area BDA may sense a user's touch input to control a displayed image and/or an internal system of the vehicle.

Because the step is defined between the button display area BDA and its adjacent display area, a user may easily find the button display area BDA by using only a haptic sense, and therefore, may easily control the image and the internal system of the vehicle.

As illustrated in FIG. 3, the stretchable display panel and the display device DD for the vehicle may include a plurality of button display areas BDA1, BDA2, BDA3, and BDA4. In an embodiment, a display surface of the first button display area BDA1 may be included in (e.g., may be part of) the second display area DA2 and may protrude to be higher than (e.g., may protrude above) a display surface of the adjacent second display area DA2 (e.g., may protrude above adjacent portions of the second display area DA2). In another embodiment, the display surface of the first button display area BDA1 may be formed to be lower than (e.g., may be sunken from) the display surface of the adjacent second display area DA2. In yet another embodiment, the first button display area BDA1 may include a first area that is lower than the adjacent second display area DA2 and a second area that is higher than the adjacent second display area DA2.

Similarly, a step may be defined between the second button display area BDA2 included in the third display area DA3 and the third display area DA3. Furthermore, steps may be defined between the third button display area BDA3 and the fourth button display area BDA4, both of which are included in the fourth display area DA4, and the fourth display area DA4.

The button display areas (e.g., the planes of the button display areas) BDA1, BDA2, BDA3 and BDA4 may have a circular shape, an elliptical shape, and/or a rectangular shape. However, these shapes are merely illustrative, and the shapes of the button display areas BDA1, BDA2, BDA3 and BDA4 are not limited to the above-described shapes.

The third button display area BDA3 may function as a transmission control button to control a transmission of the vehicle. The fourth button display area BDA4 may be formed to be similar in shape to a jog controller. For example, as illustrated in FIG. 3, the fourth button display area BDA4 may include a plurality of curved surfaces.

The touch sensor may be disposed on at least a portion of a first surface of the stretchable display panel. For example, the touch sensor may be disposed throughout the first surface of the stretchable display panel. The touch sensor may sense a user's touch.

Figure 4A:
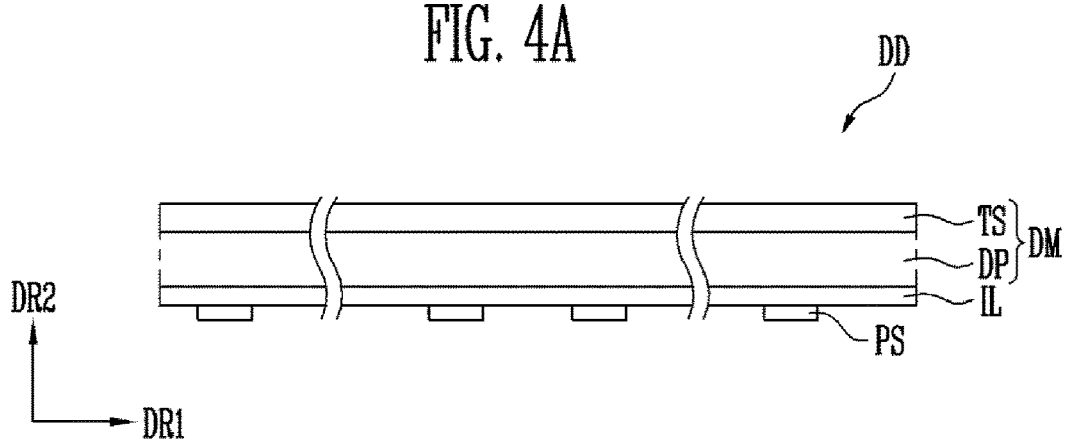
FIGS. 4A and 4B are sectional views of examples of the display device for the vehicle shown in FIG. 1.
Figure 4B:
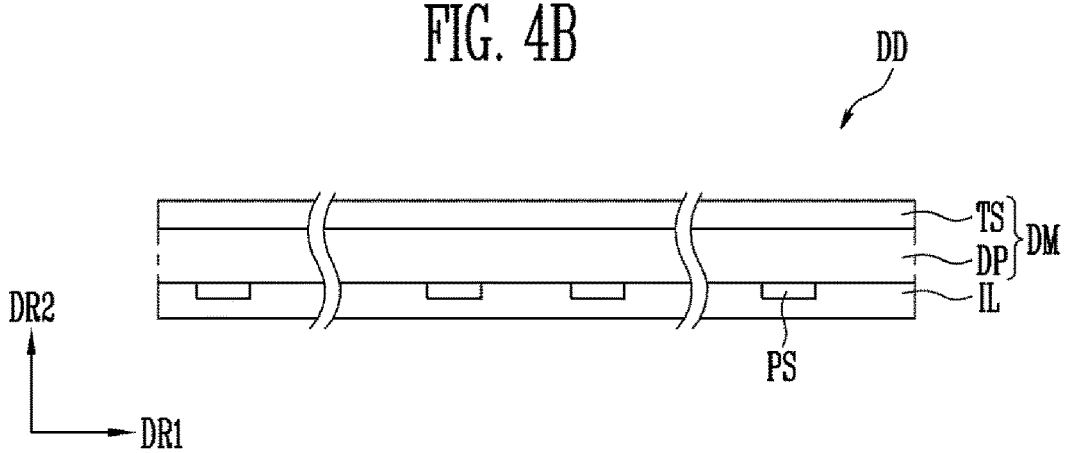

FIGS. 4A and 4B are sectional views of examples of the display device for the vehicle shown in FIG. 1.

FIGS. 4A and 4B are provided to describe the stacking relationship of functional panels and/or functional components (e.g., functional units, members, or elements) that are part of (e.g., that constitute) the display device DD for the vehicle.

Referring to FIGS. 1-4B, the display device DD for the vehicle may include the stretchable display panel DP and the touch sensor TS. In an embodiment, the display device DD for the vehicle may further include an insulator IL, a pressure sensor PS, and a support member. In addition, the display device DD for the vehicle may further include a window unit (e.g., a window) disposed on the touch sensor TS.

In FIGS. 4A and 4B, the display surface may be parallel to a surface defined by a first directional axis DR1. A normal direction of the display surface, namely, a thickness direction of the display device DD for the vehicle, may be defined as a second directional axis DR2.

Front surfaces (e.g., upper surfaces) and back surfaces (e.g., lower surfaces) of respective members, components, layers, or units that will be further described below may be distinguished by the second directional axis DR2. However, because the first and second directional axes DR1 and DR2 are merely illustrative, and because the directions indicated by the first and second directional axes DR1 and DR2 are relative concepts, they may be exchanged with each other. Hereinafter, the first and second directions are directions indicated by the first and second directions DR1 and DR2 and, thus, will carry the same reference numerals.

At least some of the pressure sensor PS, the insulator IL, the stretchable display panel DP, and the touch sensor TS may be formed by a continuous process or may be bonded to each other via an adhesive member. The adhesive member may include a common adhesive or glue. For example, the adhesive member may be an optically transparent adhesive member.

In an embodiment, the touch sensor TS may be disposed on the first surface (e.g., the upper surface) of the stretchable display panel DP. The touch sensor TS may sense contact with or input to the display surface of the display device DD for the vehicle by an external medium, such as a hand or a pen.

Referring to FIGS. 4A and 4B, when the touch sensor TS is formed with another configuration (e.g., another element or component) through the continuous process, the associated configuration is expressed as a "layer". When the touch sensor is coupled with another configuration via the adhesive member, the associated configuration is expressed as a "panel". The panel may include a base layer providing a base surface, for instance, a synthetic resin film, a composite film, a glass substrate, and the like, but in some embodiments, the base layer may be omitted. In other words, the above-described units expressed as "layers" may be disposed on the base surface having other units (or components or elements) thereon.

The touch sensor TS may be referred to as a touch panel or a touch sensor layer depending on whether or not the base layer is present.

In an embodiment, the stretchable display panel DP and the touch sensor TS disposed on the stretchable display panel DP may be combined (e.g., may be adhered to each other or otherwise coupled to each other) to define a display module DM. The touch sensor TS may be disposed in or on the stretchable display panel DP.

In an embodiment, the stretchable display panel DP may be a light emitting display panel, but the present disclosure is not limited to any type of display panel. For example, the stretchable display panel DP may be a spontaneous (or self-emissive) emission display panel including an organic-light emitting device or an inorganic-light emitting device.

In an embodiment, a functional layer, such as a fingerprint-resistant layer, an anti-reflection layer, or a hard coating layer, may be further disposed on the display module DM. In other embodiments, the sequence of stacking (e.g., the stacking order of) the touch sensor TS and the anti-reflection layer may be reversed.

The stretchable display panel DP may include (or may contain) a bendable or flexible material. The stretchable display panel DP may be extended (e.g., stretched) or shrunk by control or external stimuli (e.g., may be extended or shrunk by another component or may be pulled or pushed by a user). The stretchable display panel DP may include a substrate, a backplane structure including transistors, a pixel structure including a light emitting device, and a thin-film sealing layer. The stretchable display panel DP may be extended or shrunk by drawing (e.g., pulling or releasing) the substrate. An example of the substrate of the stretchable display panel DP will be described, in detail, with reference to FIG. 5.

The touch sensor TS may include a plurality of sensing electrodes. The touch sensor TS may be a resistive film type, a light sensing type, and/or a capacitance type. FIGS. 4A and 4B show that the touch sensor TS completely overlaps the stretchable display panel DP. However, this is only one example, and the touch sensor TS may overlap only a portion of the display area.

The touch sensor TS may be a touch sensing panel that senses a user's touch, or a fingerprint sensing panel that senses fingerprint information of a user's finger. Pitches of the sensing electrodes (e.g., distance between adjacent sensing electrodes) and widths of the sensing electrodes may be suitably varied depending on the purpose of the touch sensor TS.

In an embodiment, the pressure sensor PS may be disposed on the second surface (e.g., the back surface or lower surface) of the stretchable display panel DP. For example, the pressure sensor PS and the touch sensor TS may be disposed on opposite sides of the stretchable display panel DP.

The pressure sensor PS may be disposed to overlap the button display area BDA. The pressure sensor PS may include an upper electrode layer, a lower electrode layer, and an elastic layer interposed between the upper electrode layer and the lower electrode layer. The pressure sensor PS may detect pressure applied thereto in response to a change in a gap (e.g., a change in a distance) between the upper electrode layer and the lower electrode layer. However, this is merely illustrative, and the pressure sensor PS is not limited thereto (e.g., the pressure sensor PS may operate according to different principles).

For example, the pressure sensor PS may include (e.g., may be composed of) a piezoelectric material and a plurality of conductive layers. The pressure sensor PS may perform both a pressure sensing function by converting mechanical stress into an electric signal by using a piezoelectric effect and a haptic function by converting an electric signal into mechanical strain (e.g., vibration).

In the embodiment illustrated in FIG. 4A, the insulator IL may be interposed between the stretchable display panel DP and the pressure sensor PS. The insulator IL may be disposed on the second surface of the stretchable display panel DP. Furthermore, the insulator IL may extend to the periphery of the button display area BDA. For example, the insulator IL, in the form of a film, may be disposed on the lower surface of the stretchable display panel DP.

The insulator IL may reduce friction between the support member, which forms the step of the button display area BDA of the stretchable display panel DP, and the stretchable display panel DP. Thus, stress concentrated on the button display area BDA, which protrudes above or is depressed below the peripheral display area, may be dispersed.

The insulator IL may include (e.g., may contain) an organic material having a low frictional coefficient (e.g., a low coefficient of friction). For example, the insulator IL may include at least one of polyimide, nylon, acetal, polyphenylene sulfide, polyester, fluorine resin, and others.

In the embodiment illustrated in FIG. 4B, the insulator IL may be disposed to cover the pressure sensor PS. The insulator IL may be interposed between the pressure sensor PS and the support member located under the pressure sensor PS. In this embodiment, a portion of the insulator IL contact the stretchable display panel DP in an area where the pressure sensor PS is not located.

FIG. 5 is a view of an example of a portion of the substrate included in the stretchable display panel of the display device for the vehicle shown in FIG. 1.

Referring to FIGS. 1-5, the substrate SUB of the stretchable display panel DP is stretchable (e.g., may be extended or shrunk) in reference directions (e.g., in one or more predetermined directions).

The substrate SUB may include islands IS and bridges BR that are separated from each other by a cutout Co. The cutout Co may be an opening that is formed by eliminating (or removing) a portion of the substrate SUB. For example, a portion of the substrate SUB, for example, the stretchable area at where the substrate SUB is substantially stretched, may be configured such that the island IS and the bridges BR connected to the edge of the island IS may be arranged in a third direction DR3 and a fourth direction DR4. In this embodiment, the third direction DR3 and the fourth direction DR4 may be substantially parallel to the display surface or the surface of the substrate.

A pixel structure (e.g., a thin film transistor, a capacitor, a light emitting device, etc.) may be formed on each island IS. One or more pixel(s) may be formed (e.g., one or more pixel(s) may be formed on each island IS). For example, a first light emitting area EA1, a second light emitting area EA2, and a third light emitting area EA3 included in one pixel may be provided on the island IS (e.g., may be provided on one island). The first to third light emitting areas EA1, EA2, and EA3 may correspond to first to third sub-pixels, respectively. For example, the first, second, and third sub-pixels may emit red light, green light, and blue light, respectively.

Wires may be formed on each bridge BR to supply power voltage, a data signal, a scan signal, etc. to the pixel structure.

However, the arrangement shown in FIG. 5 is merely illustrative, and the substrate SUB for forming the stretchable display panel DD is not limited thereto.

Figure 6A:
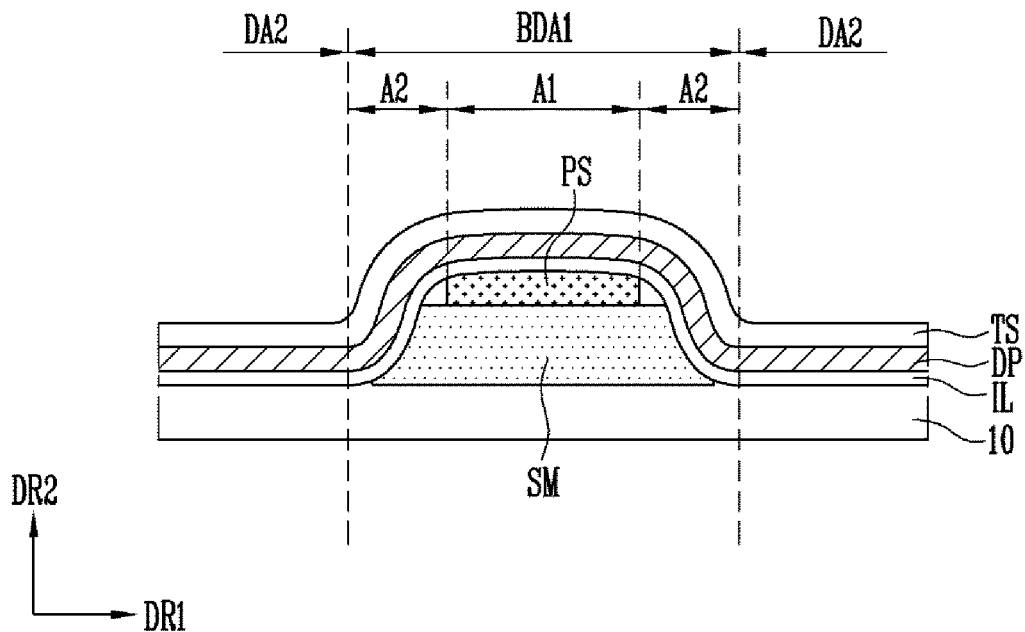
FIGS. 6A-6C are sectional views of examples of a button display area of the display device for the vehicle shown in FIG. 1.

FIG. 6A is a sectional view of an example of the button display area of the display device for the vehicle shown in FIG. 1.

Referring to FIGS. 1-6A, the display surface of the first button display area BDA1 may protrude with respect to the display surface of the adjacent display area (e.g., the second display area DA2).

The structure and/or configuration of the first button display area BDA1 illustrated in FIG. 6A may be substantially equally applied to the plurality of button display areas (e.g., the structure and/or configuration of the first button display area BDA1 illustrated in FIG. 6A may be representative of some or all of the button display areas). Hereinafter, the first button display area BDA1 will be described as the button display area BDA1.

In an embodiment, the display device DD for the vehicle may include the support member SM, the insulator IL, the pressure sensor PS, the stretchable display panel DP, and the touch sensor TS. The display device DD for the vehicle may further include a window disposed on the touch sensor TS.

The support member SM may be disposed on the surface of the center fascia 10. The support member SM may provide (or maintain) the protruding shape of the button display area BDA1 and may support the pressure sensor PS. In an embodiment, the support member SM may include an insulation material, such as a plastic.

The support member SM may be fixed on the surface of the center fascia 10 and may determine the button shape (e.g., the three-dimensional shape of the button display area BDA1) of the button display area BDA1 of the stretchable display panel DP. For example, when the plane of the support member SM has a rectangular shape (e.g., when the support member SM has a rectangular planar shape), the plane of the button display area BDA1 may also have a rectangular shape.

Furthermore, the support member SM may provide a repulsive force to reinforce the sensitivity of the pressure sensor PS, vertical vibration of the pressure sensor PS, and the like.

The pressure sensor PS may be disposed on the support member SM. In an embodiment, the pressure sensor PS may include an upper electrode layer, a lower electrode layer, and an elastic layer interposed between the upper electrode layer and the lower electrode layer. However, this is merely illustrative, and the pressure sensor PS may be configured to include or may have various known suitable structures.

In an embodiment, the pressure sensor PS may overlap a first portion A1 in the button display area BDA1. The first portion A1 may be a portion having a display surface that is substantially parallel to the plane defined by the first direction DR1. For example, the first portion A1 may correspond to a central portion of the button display area BDA1. However, this is merely illustrative, and the display surface of the first portion A1 may be curved (e.g., may have a curvature). For example, the display surface of the first portion A1 may be a curved surface having a plurality of curvatures.

A second portion A2 may correspond to an inclined surface connecting (e.g., extending between) the first portion A1 and the display area (e.g., the second display area DA2) adjacent to the button display area BDA1. Thus, the pressure sensor PS may sense pressure in (e.g., may sense pressure applied to) the first portion A1. However, this is merely illustrative, and the pressure sensor PS may be disposed on the upper surface of the stretchable display panel PS.

The display surface (e.g., the inclined surface) of the second portion A2 may be curved (e.g., may have a curvature). For example, the display surface of the second portion A2 may be a curved surface having a plurality of curvatures.

The insulator IL may be disposed on the pressure sensor PS. The insulator IL may extend to the periphery of the button display area BDA2.

In an embodiment, the pressure sensor PS may include a haptic actuator to give a user haptic information (e.g., to provide haptic feedback to a user). Thus, when the user applies pressure to the button display area BDA1, the user may feel the effect of manipulating the physical button (e.g., the user may feel a sensation as if a physical button was being manipulated).

The insulator IL may contact the back surface of the stretchable display panel DP. The insulator IL may function as a friction reducing layer to reduce friction between the support member SM and the stretchable display panel DP. Thus, the insulator IL may disperse stress concentrated on the button display area BDA of the stretchable display panel DP, which protrudes to be higher than the peripheral area.

The stretchable display panel DP may be disposed on the insulator IL. The button display area BDA1 of the stretchable display panel DP may protrude in the second direction DR2 depending on the shape of the support member SM.

The button display area BDA1 may display a button image or a continuous image on the peripheral display area (e.g., the second display area DA2) depending on the situation.

The stretchable display panel DP may include the inclined surface corresponding to the second portion A2. The inclined surface may provide a three-dimensional effect (e.g., a three-dimensional structure or shape) for the button display area BDA1.

The touch sensor TS may be disposed on the stretchable display panel DP. The touch sensor TS may sense a user's touch. The touch sensor TS may have (or may form) the planar shape of the stretchable display panel DP and may protrude in the button display area BDA1 with respect to the adjacent display area in the second direction DR2.

The touch sensor TS may be disposed to correspond to the button display area BDA1. In an embodiment, the touch sensor TS may be formed to extend from the button display area BDA1 to the peripheral display area, such as the second display area DA2.

As described above, the display device DD for the vehicle according to embodiments of the present disclosure may implement an integrated large screen conforming to the shape of the center fascia 10 by using the stretchable display panel DP. Furthermore, a three-dimensional button display may be implemented by the stretchable display panel DP. Therefore, a physical button, a dial, and/or a jog controller on the center fascia 10 may be omitted and the aesthetic effect of the interior design of the vehicle may be improved. Furthermore, the convenience and stability of operation may be enhanced while the vehicle is being driven by implementing a three-dimensional button display by using the stretchable display panel DP.

Figure 6B:
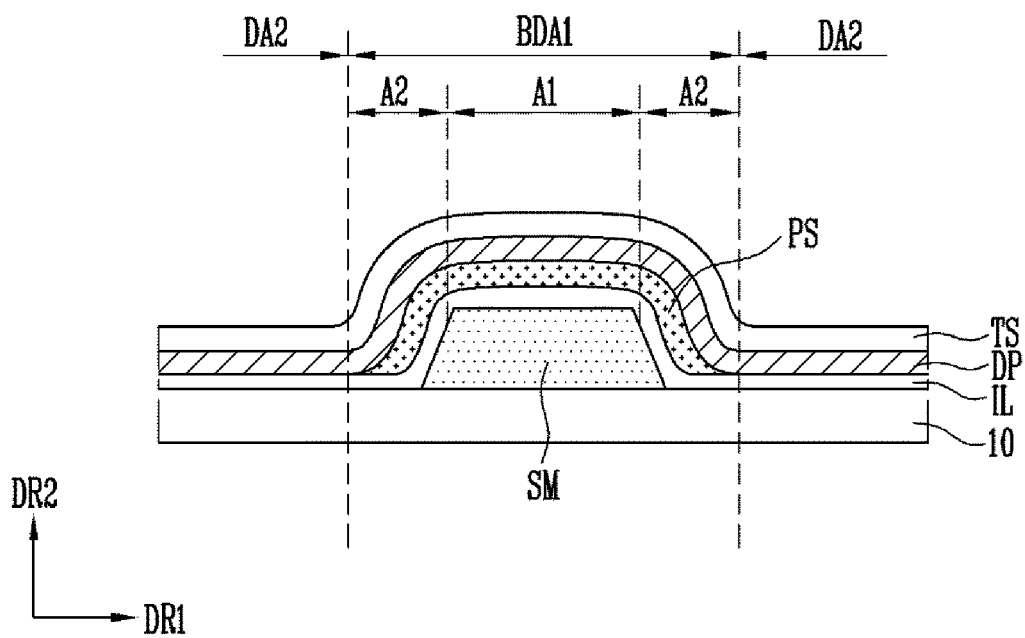
Figure 6C:
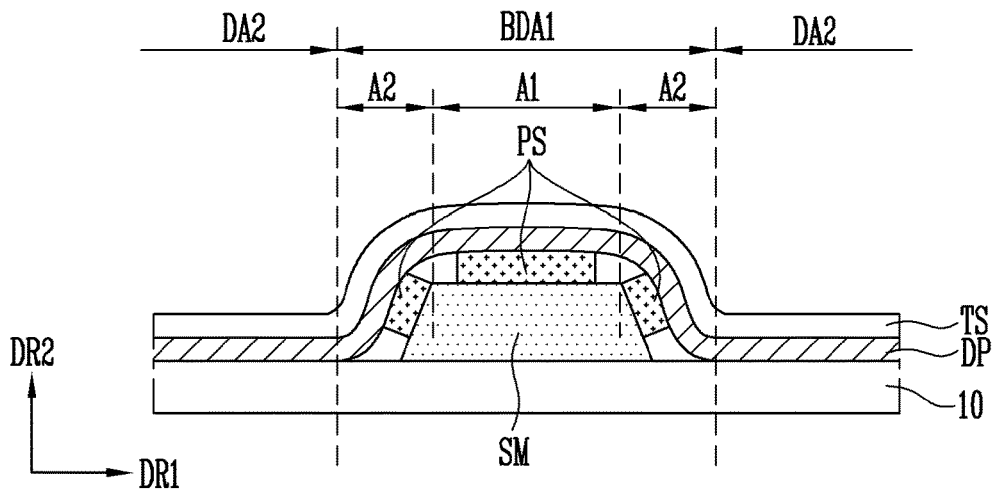

FIGS. 6B and 6C are sectional views of other examples of the button display area of the display device for the vehicle shown in FIG. 1.

Components of FIGS. 6B and 6C that have the same reference numerals as the components described above with reference to FIG. 6A are the same or substantially the same as the previously-described components, and as such, duplicate descriptions of thereof may be omitted. Furthermore, the button display area of the display device for the vehicle shown in FIGS. 6B and 6C may be the same or substantially equal or similar in configuration to the button display area shown in FIG. 6A, except for the arrangement of the insulator IL and/or the pressure sensor PS.

Referring to FIGS. 6B and 6C, the display surface of the first button display area BDA1 may protrude to be higher than (e.g., may protrude above) the display surface of the adjacent display area (e.g., the second display area DA2).

In the embodiment illustrated in FIG. 6B, the insulator IL may be interposed between the support member SM and the pressure sensor PS. For example, the pressure sensor PS may be disposed on the insulator IL, which has the friction reducing function.

Furthermore, the pressure sensor PS may be disposed on the first portion A1 and the second portion A2. Thus, pressure on (e.g., pressure applied to) the inclined surface of the button display area BDA1 may be sensed as well as pressure applied to the planar or substantially planar surface of the button display area BDA1). For example, as illustrated in FIG. 6B, the pressure sensor PS may be continuously disposed on the first portion A1 and the second portion A2. In the embodiment illustrated in FIG. 6C, the pressure sensor PS is discontinuously disposed on the first portion A1 and the second portion A2.

Figure 7A:
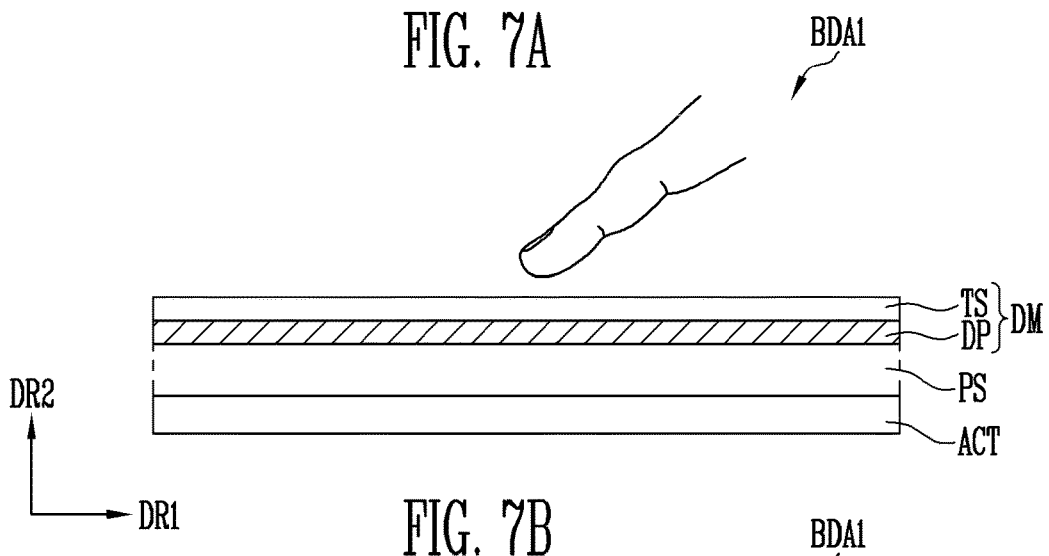
FIGS. 7A and 7B are sectional views of examples of a pressure sensor included in the display device for the vehicle of shown in FIG. 1.
Figure 7B:
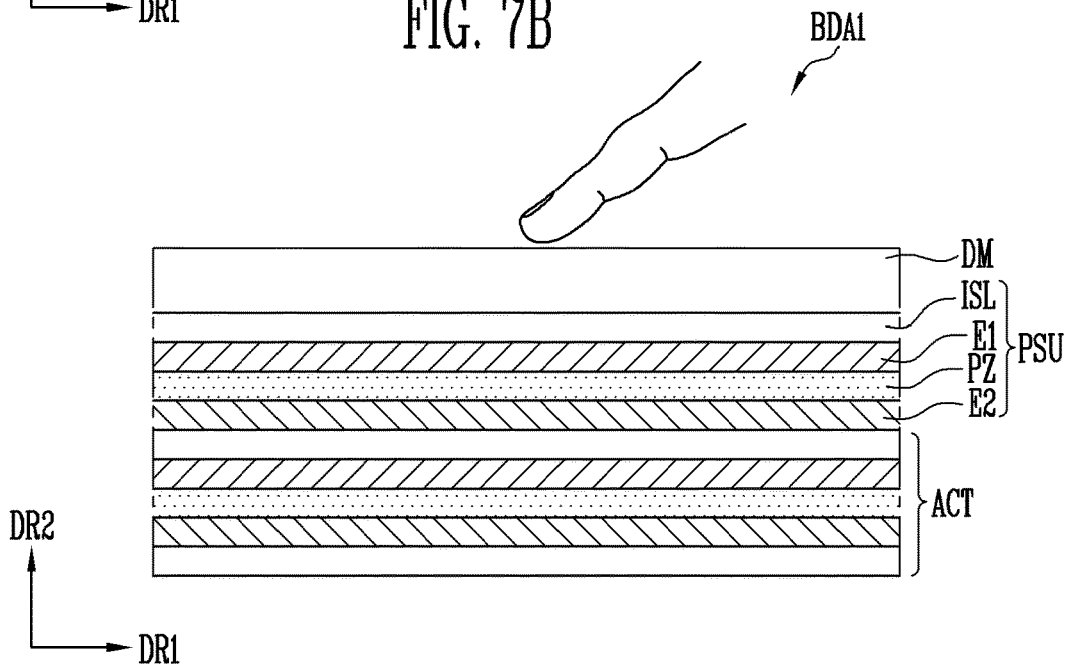

FIGS. 7A and 7B are sectional views of examples of the pressure sensor included in the display device for the vehicle shown in FIG. 1.

Referring to FIGS. 1-7B, the display device DD for the vehicle may include the pressure sensor PS and the haptic actuator ACT disposed under the display module DM.

In an embodiment, the pressure sensor PS and the haptic actuator ACT may overlap each other in the button display area BDA1.

The pressure sensor PS may include the upper electrode layer, the lower electrode layer, and the elastic layer disposed between the upper electrode layer and the lower electrode layer. However, this is merely illustrative, and the pressure sensor PS may be configured to have various known suitable structures.

The haptic actuator ACT may be disposed between the pressure sensor PS and the display module DM or between the pressure sensor PS and the support member (designated as SM in FIGS. 6A-6C). In an embodiment, the haptic actuator ACT may vibrate in response to a change in a magnetic field. For example, the haptic actuator ACT may be a spring-mass system that changes vibration (e.g., the vibrates) in response to a change in the magnetic field or may be a linear resonant actuator. However, this is merely illustrative, and the configuration of the haptic actuator ACT is not limited thereto. For example, the haptic actuator ACT may include an eccentric motor (e.g., an eccentric rotating mass (ERM)), which is a type of vibration motor.

A button effect, a key effect, a dial effect, and the like may be implemented by the haptic actuator ACT in the button display area BDA1.

In the embodiment illustrated in FIG. 7B, the pressure sensor PS may include a plurality of electrode layers E1 and E2 that are stacked on each other in the vertical direction and a plurality of piezoelectric layers PZ that are disposed between the electrode layers E1 and E2, respectively. The electrode layers E1 and E2 and the piezoelectric layer PZ may form a piezoelectric element.

In an embodiment, the pressure sensor PS may include a plurality of piezoelectric elements that are separated from each other by the insulator ISL. For example, some of the piezoelectric elements may function as a pressure sensor unit PSU while others may function as the haptic actuator ACT. For example, the pressure sensor PS and the haptic actuator ACT may be formed by using the plurality of piezoelectric elements.

In an embodiment, the plurality of piezoelectric elements is stacked on each other in the second direction DR2, thus enhancing the haptic effect, such as the generation of vibration due to a touch.

Although in the embodiment shown in FIG. 7B the electrode layers E1 and E2 forming the piezoelectric element are stacked on each other in the second direction DR2 (e.g., the vertical direction), the configuration of the piezoelectric element is not limited thereto. For example, the first electrode E1 and the second electrode E2 may be disposed in (e.g., arranged adjacent each other in) the first direction DR2 (e.g., the horizontal direction), and the piezoelectric material may be interposed between the first electrode E1 and the second electrode E2.

The piezoelectric layer PZ may include a transparent organic material or a transparent inorganic material having piezoelectric properties. For example, the piezoelectric layer PZ may contain polyvinylidene fluoride (PVDF) piezoelectric material as the organic material or a piezoelectric ceramic material as the inorganic material. Examples of the piezoelectric ceramic material include lead zirconate titanate (PZT), zinc oxide (ZnO), barium titanate (BaTiO$_3$), aluminum nitride (AlN), and the like.

As such, the haptic actuator ACT and/or the pressure sensor PS having the haptic function may be disposed in the button display area BDA1 of the stretchable display panel DP, thus providing a three-dimensional button display having the same or substantially similar effect as the operation of a physical button.

Figure 8:
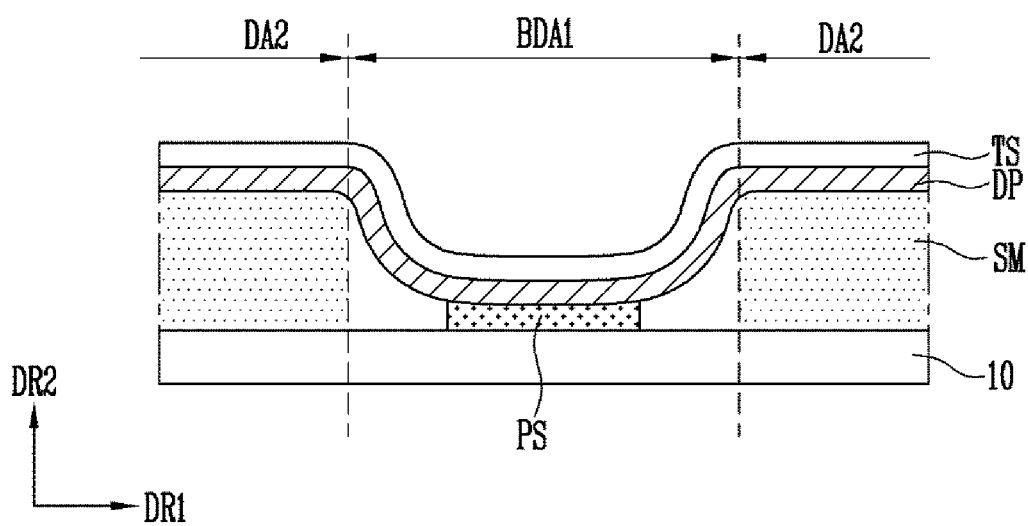
FIG. 8 is a sectional view of an example of a button display area of the display device for the vehicle shown in FIG. 1.

FIG. 8 is a sectional view of an example of the button display area of the display device for the vehicle shown in FIG. 1.

Components of FIG. 8 that have the same reference numerals as components described above with reference to FIG. 6A are the same or are substantially the same, and thus, duplicate descriptions thereof may be omitted. Furthermore, the button display area of the display device for the vehicle shown in FIG. 8 may be the same or substantially equal or similar in configuration to the button display area shown in FIG. 6A, except for the curved shape of the stretchable display panel DP.

Referring to FIG. 8, the display surface of the button display area BDA1 may be concave (or depressed) to be lower than (e.g., below) the display surface of the adjacent display area (e.g., the second display area DA2).

The display device DD for the vehicle may include the support member SM, the pressure sensor PS, the stretchable display panel DP, and the touch sensor TS. The display device DD for the vehicle may further include a window disposed on the touch sensor TS and an insulator interposed between the support member SM and the stretchable display panel DP to reduce friction.

In an embodiment, the support member SM may be disposed in the display area DA2 adjacent to the button display area BDA1. Thus, the button display area BDA1 may be concave (or depressed) to be lower than the peripheral second display area DA2.

Because the step is defined between the button display area BDA1 and its peripheral display area, a user may easily find the button display area BDA1 by using only a haptic sense and may easily control the image and the internal system of the vehicle.

Figure 9A:
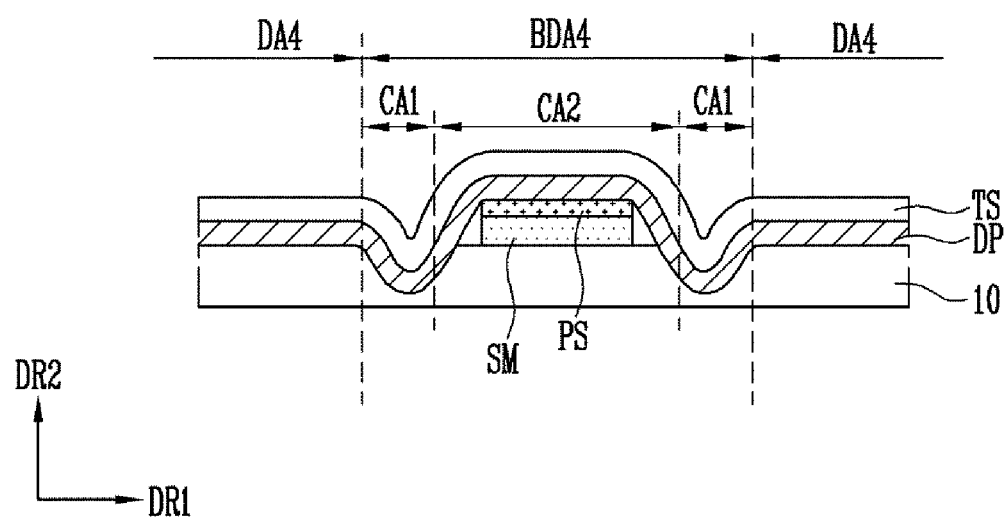
FIGS. 9A and 9B are sectional views of examples of a button display area of the display device for the vehicle shown in FIG. 1.
Figure 9B:
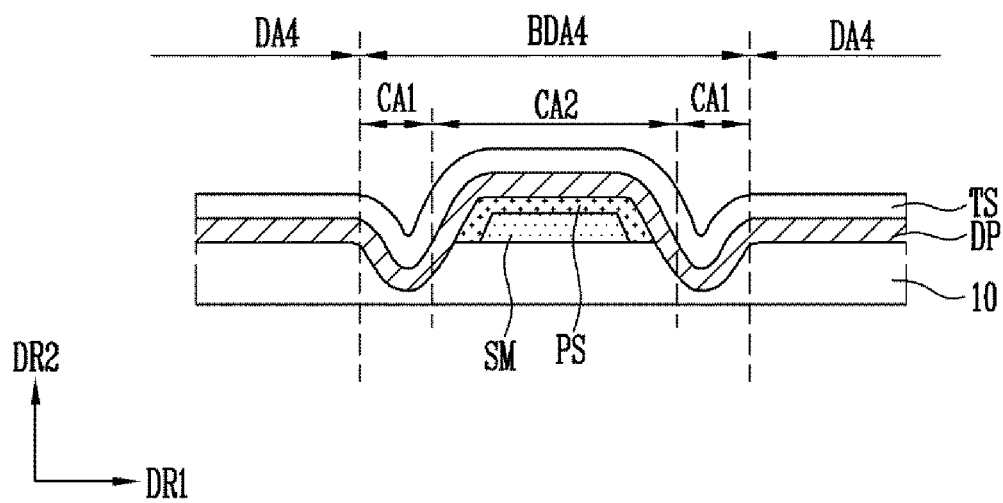

FIGS. 9A and 9B are sectional views of examples of the button display area of the display device for the vehicle shown in FIG. 1.

Components of FIGS. 9A and 9B that have the same reference numerals as components described above with reference to FIG. 6A are the same or substantially similar, and thus, duplicate descriptions thereof may be omitted. Furthermore, the button display area of the display device for the vehicle shown in FIGS. 9A and 9B may be the same as or substantially equal or similar in configuration to the button display area shown in FIG. 6A, except for the curved shape of the stretchable display panel DP.

FIGS. 9A and 9B show examples of the fourth button display area BDA4 shown in FIG. 3. Hereinafter, the fourth button display area BDA4 will be described as the button display area BDA4.

Referring to FIGS. 9A and 9B, the button display area BDA4 may include a first area CA1 depressed to be lower than the adjacent display area (e.g., the fourth display area DA4) and a second area CA2 protruding to be higher than the adjacent display area. For example, the button display area BDA4 may be of a similar shape to a jog controller.

The display device DD for the vehicle may include the support member SM, the pressure sensor PS, the stretchable display panel DP, and the touch sensor TS. The display device DD for the vehicle may further include a window disposed on the touch sensor TS and an insulator interposed between the support member SM and the stretchable display panel DP to reduce friction.

The support member SM may be disposed to overlap at least a portion of the button display area BDA4. For example, the support member SM may overlap the second area CA2.

Furthermore, the pressure sensor PS may be disposed to overlap the support member SM. The pressure sensor PS may further include the haptic actuator described above with reference to FIG. 7A or 7B.

In the embodiment illustrated in FIG. 7A, the pressure sensor PS is disposed on a surface of the second area CA2 that is substantially parallel to the first direction DR1.

In another embodiment illustrated in FIG. 7B, the pressure sensor PS is disposed to overlap at least a portion of the inclined surface of the button display area BDA4. In this embodiment, a pressure sensing operation and a haptic response may be performed even on the inclined surface of the button display area BDA4. Therefore, a jog control effect, a dial effect, and the like may be realized by a touch operation on the inclined surface (e.g., the side surface) of the button display area BDA4.

The stretchable display panel DP may include a concave first area CA1 and a convex second area CA2 with respect to the adjacent display area DA4 based on the surface curvature of the center fascia 10 and the arrangement of the support member SM. For example, because the step is defined between the button display area BDA4 and its peripheral display area DA4, a user may easily find the button display area BDA4 by using only a haptic sense and may easily control the image and the internal system of the vehicle.

Figure 10A:
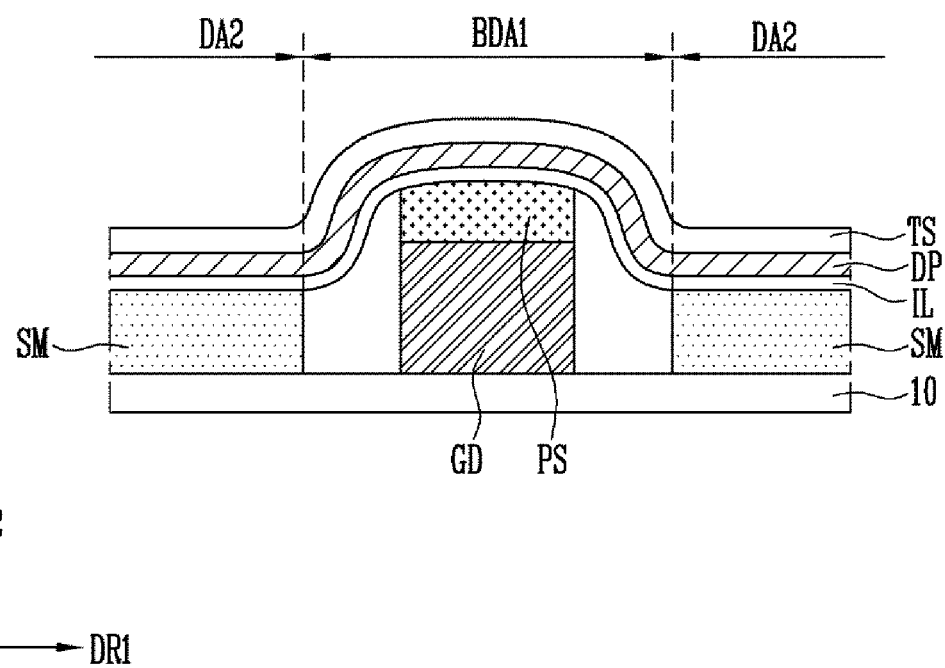
FIGS. 10A-10C are sectional views of examples of a button display area of the display device for the vehicle shown in FIG. 1.
Figure 10B:
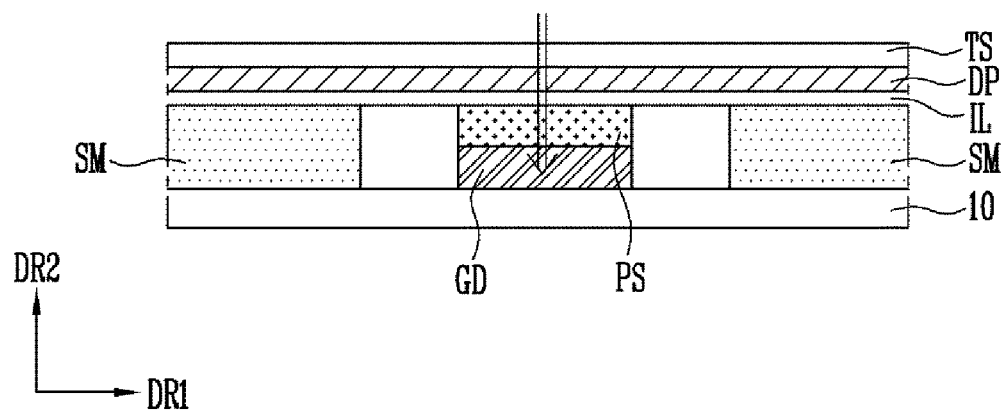
Figure 10C:
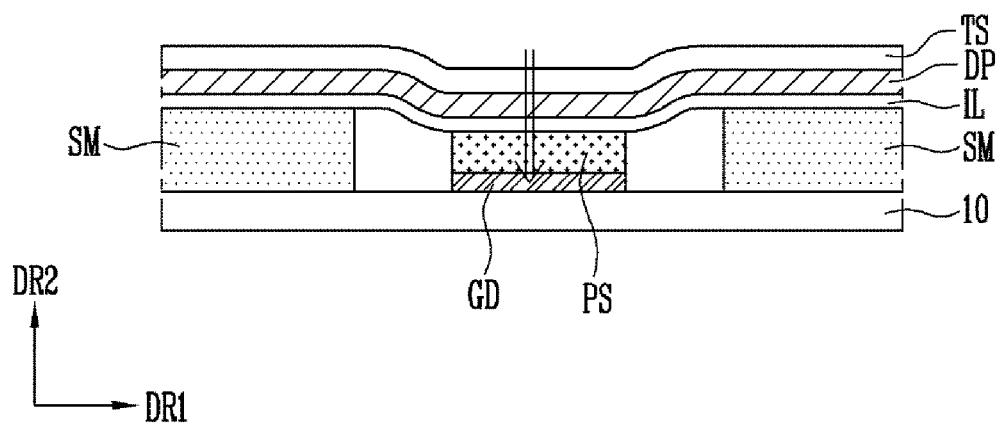

FIGS. 10A-10C are sectional views of examples of the button display area of the display device for the vehicle shown in FIG. 1.

Components of FIGS. 10A-10C that have the same reference numerals as components described above with reference to FIG. 6A are the same or substantially similar, and thus, duplicate descriptions thereof may be omitted. Furthermore, the button display area of the display device for the vehicle shown in FIGS. 10A-10C may be the same as or substantially equal or similar in configuration to the button display area shown in FIG. 6A, except for the movement of the button display area.

Referring to FIGS. 10A-10C, the button display area BDA1 of the stretchable display panel DP may be shrunk or extended.

In an embodiment, the touch sensor may be disposed on the first surface (e.g., the upper surface) of the stretchable display panel DP.

The pressure sensor PS may be disposed on the second surface (e.g., the back surface) of the stretchable display panel DP and may overlap the button display area BDA1. In an embodiment, the insulator IL may be interposed between the pressure sensor PS and the stretchable display panel DP to reduce the stress concentration of the stretchable display panel DP on the button display area BDA1 and reduce friction therebetween.

The display device DD for the vehicle may further include a guide member GD to control the shape of the button display area BDA1 and a support member SM to support the adjacent display area of the button display area BDA1 (e.g., the second display area DA2).

The guide member GD may be disposed to support the pressure sensor PS. For example, the guide member GD may overlap at least a portion of the button display area BDA1.

In an embodiment, the guide member GD may reciprocate in the second direction DR2 and a direction opposite to the second direction DR2. For example, the guide member GD may vertically reciprocate by (e.g., may vertically reciprocate along) one of a linear guide rail, a slide rail, and a circular guide rail. In another embodiment, the guide member GD may vertically reciprocate by a cam including a driving shaft and a cam follower. The guide member GD may include metal and/or plastic.

The support member SM may be disposed between the center fascia 10 and a portion of the stretchable display panel DP. The support member SM may overlap the adjacent display area DA2 of the button display area BDA1. The support member SM may fixedly support the adjacent display area DA2 of the button display area BDA1. The support member SM may be fixed so as not to move on the center fascia 10.

The button display area BDA1 of the stretchable display panel DP may be shrunk or extended due to the vertical movement of the guide member GD. Thus, it is possible to regulate (e.g., change or vary) the step between the button display area BDA1 of the stretchable display panel DP and the display area DA2 adjacent thereto.

As illustrated in FIG. 10A, when the guide member GD moves in the second direction DR2 (e.g., moves up in the second direction DR2), the button display area BDA1 of the stretchable display panel DP may be extended and may have a convex plane (e.g., a convex upper surface) higher than the adjacent display area DA2.

When the guide member GD moves in the direction opposite to the second direction DR2 (e.g., moves down in the direction opposite to the second direction DR2), the button display area BDA1 of the stretchable display panel DP may be shrunk. In the embodiment illustrated in FIG. 10B, the step between the button display area BDA1 and the display area DA2 adjacent thereto may be eliminated. Furthermore, as illustrated in FIG. 10C, the button display area BDA1 may have a concave display surface that is lower than the display area DA2 adjacent thereto.

As such, according to the stretchable properties of the stretchable display panel DP, a three-dimensional button display may be realized by using only one guide member GD that moves vertically, without an additional guide member and controller for changing a shape of the button display.

The movement of the guide member GD may be suitably adjusted according to a user's setting or a screen displayed by the display device DD for the vehicle. Thus, the shape of the button display area BDA1 may be controlled to fit a user's environment, thus improving a user's convenience when the display or the vehicle is controlled during driving.

Figure 11:
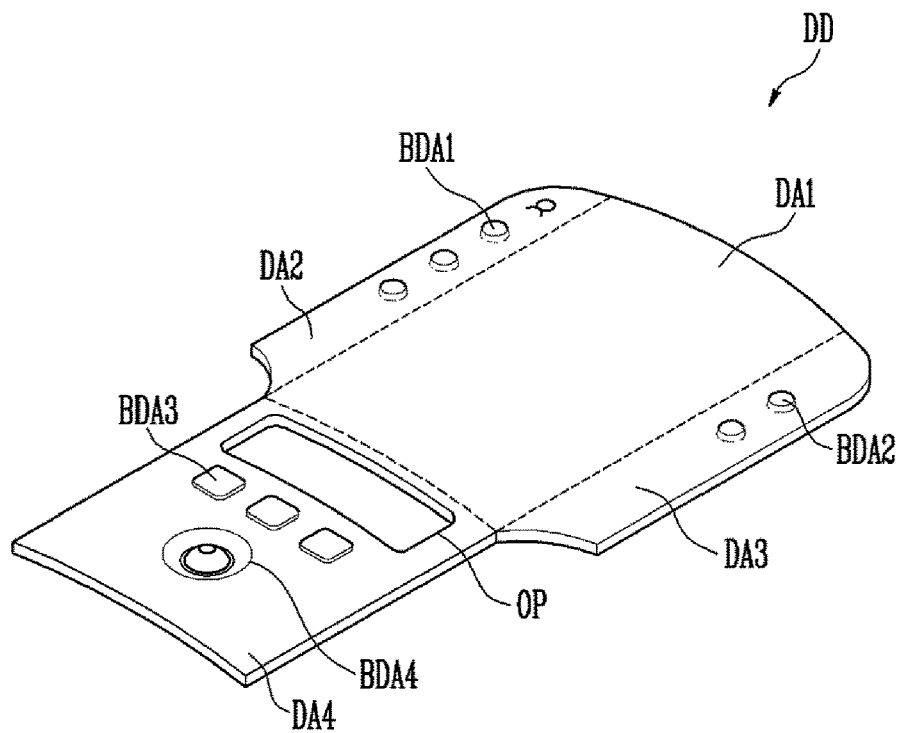
FIG. 11 is a schematic view of an example of the display device for the vehicle shown in FIG. 1.

FIG. 11 is a schematic view of an example of the display device for the vehicle shown in FIG. 1.

Components of FIG. 11 that have the same reference numerals as components described above with reference to FIG. 3 are the same or substantially similar, and thus, duplicate descriptions thereof may be omitted.

Referring to FIGS. 1-11, the display device DD for the vehicle including the stretchable display panel may include a plurality of display areas DA1-DA4 corresponding to the shape of the center fascia 10.

In an embodiment, the stretchable display panel may include a first display area DA1 located on a front of the center fascia 10, a second display area DA2 located on a first side extending from the center fascia 10 towards the driver's seat, and a third display area DA3 located on a second side extending from the center fascia 10 towards the passenger seat. The stretchable display panel may further include a fourth display area DA4 extending from the center fascia 10 to a lower control pad. Furthermore, a plurality of button display areas BDA1, BDA2, BDA3, and BDA4 may be included in at least some of the first to fourth display areas DA1-DA4.

The first to fourth display areas DA1-DA4 and the button display areas BDA1, BDA2, BDA3, and BDA4 may be integrally formed.

In an embodiment, the stretchable display panel may include at least one opening OP. The opening OP may be formed to correspond to the shape of the center fascia 10. For example, the opening OP may be formed to correspond to the location of a cup holder, an air vent, a cigar jack, an AUX cable input terminal, a USB input terminal, or the like of the vehicle.

Thus, a display device DD for the vehicle that is freely formable to correspond to the interior of the vehicle may be provided to the vehicle.

Figure 12:
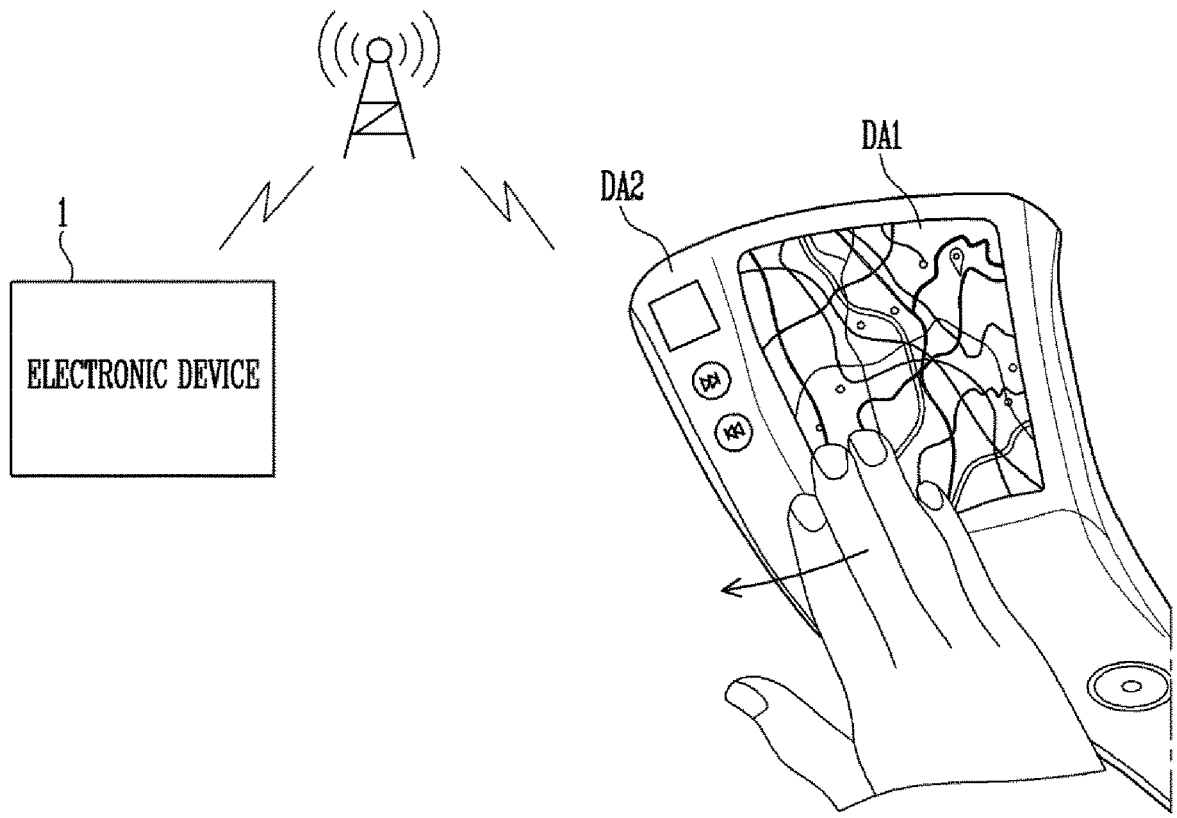
FIG. 12 is a view of an example of an operation of the display device for the vehicle shown in FIG. 1.

FIG. 12 is a view of an example of an operation of the display device for the vehicle shown in FIG. 1.

Referring to FIGS. 1-3 and 12, the display device DD for the vehicle may control the vehicle or communication of the vehicle in response to a user's gesture and/or the movement of the image.

The display device DD for the vehicle may be paired with an electronic device 1 in the vehicle by using a local field communication method and may wirelessly exchange data with another vehicle, a server, or the like by using a long-range radio communication module of the electronic device 1. In another embodiment, the display device DD for the vehicle may wirelessly exchange data with the electronic device 1, another vehicle, a server, or the like via a communication module that is installed in the vehicle itself.

Navigation information may be displayed in the first display area DA1, while contact information, the information of another electronic device 1, and the like may be displayed in the second display area DA2 adjacent to the driver's seat. The image information displayed on the first display area DA1 may be transmitted to or shared with another electronic device 1 by a gesture, such as a swipe or a drag from the first display area DA1 to the second display area DA2, or the image movement from the first display area DA1 to the second display area DA2.

Likewise, the image information of the second display area DA2 or the information received from another electronic device 1 may be displayed on the first display area DA1 in response to a gesture, such as the swipe or the drag from the second display area DA2 to the first display area DA1.

Thus, the information may be freely transmitted and shared between the different display areas and with external components without disturbing the user driving.

Figure 13A:
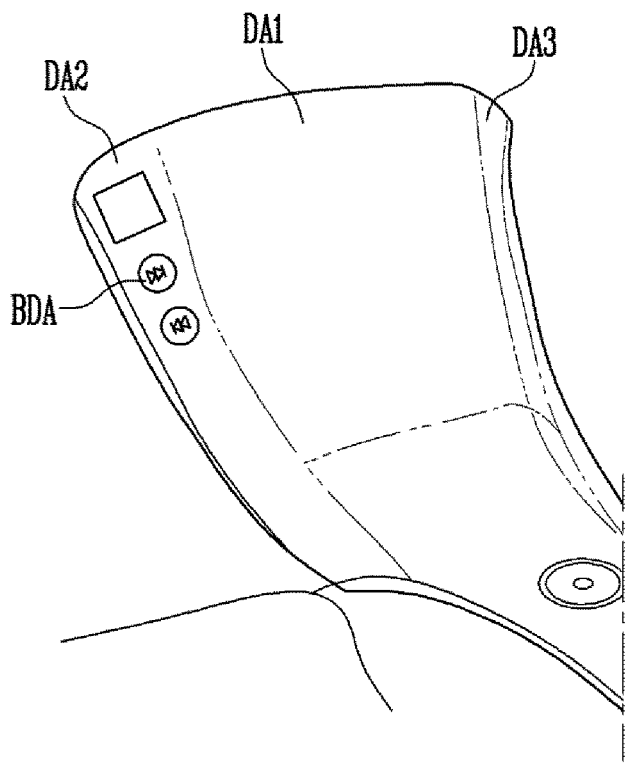
FIGS. 13A-13C are views of examples of an image displayed on the display device for the vehicle shown in FIG. 1.
Figure 13B:
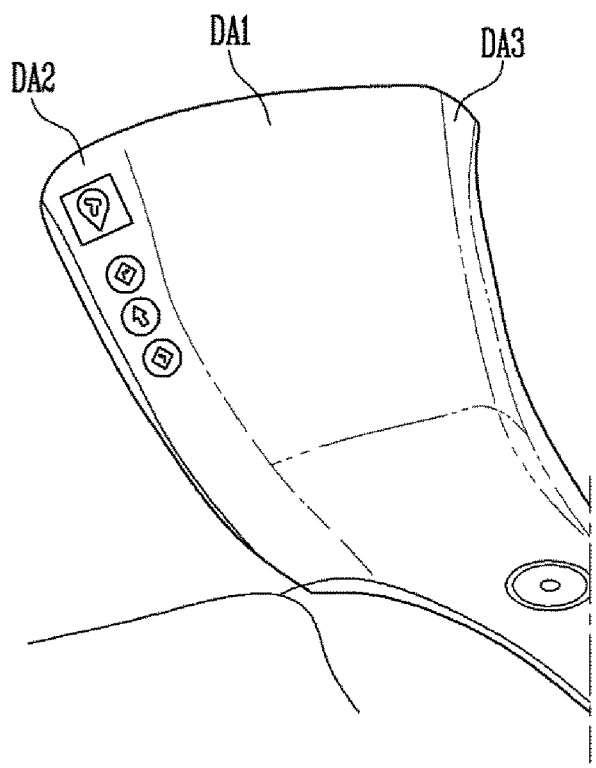
Figure 13C:
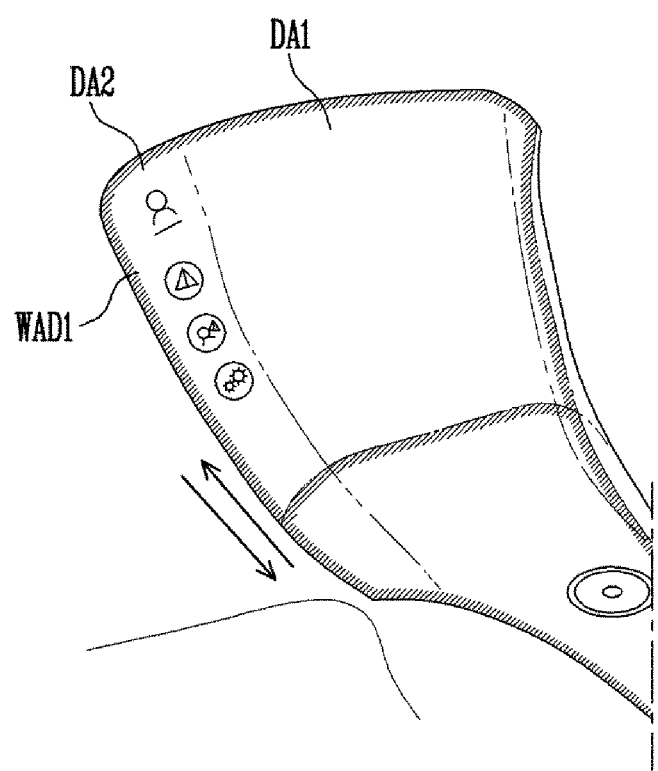

FIGS. 13A-13C are views of examples of an image displayed on the display device for the vehicle shown in FIG. 1

Referring to FIGS. 1-3 and 13A-13C, the display device DD for the vehicle may include a plurality of display areas DA1-DA4. Each of the display areas DA1-DA4 may display various pieces of image information.

The button display area BDA with the step defined between the button display area BDA and the adjacent display area may be located in some of the display areas DA1-DA4.

The display device DD for the vehicle and the stretchable display panel included therein may display audio-control information, air-conditioning-control information, navigation information, and other information of the vehicle.

However, this is merely illustrative, and various image information for a user's convenience may be displayed on the display areas DA1-DA4.

In an embodiment, icons corresponding to an application and a control function may be displayed on the second display area DA2 adjacent to the driver's seat and the third display area DA3 adjacent to the passenger seat. For example, as illustrated in FIG. 13A, image information related to music playing may be displayed on the second display area DA2. In this case, music volume, current playing music, or the like may be controlled by a user's gesture (e.g., a swipe, etc.) on the second display area DA2.

Furthermore, as illustrated in FIG. 13B, turn by turn direction information of the navigation system may be displayed on the second display area DA2.

However, this is merely illustrative, and image information, such as the remaining amount of fuel, weather, vehicle lighting, the internal temperature of the vehicle, degree of pollution, navigation, and the like may be displayed on any of the first to fourth display areas DA1-DA4.

The vehicle's internal system may be controlled by a touch operation on the control display. For example, seat temperature, internal temperature, lighting, vehicle windows, the brightness of the cluster display, the shape and position of the seat, etc. may be controlled by a touch operation on the image information displayed on the display device DD for the vehicle.

In an embodiment, the display device DD for the vehicle may extend integrally to the center fascia 10, the lower control pad 40, the cluster 30, and the dashboard in front of the passenger seat. In the event of an emergency or if a caution or warning is to be displayed, a warning image may be displayed throughout the display device DD for the vehicle. For example, as illustrated in FIG. 13C, the warning image (WAD1) corresponding to boundary lines of the display areas DA1-DA4 may be flashed. Thus, the warning can be effectively transmitted to a driver. Therefore, it is possible to improve driving stability.

As described above, the display device DD for the vehicle according to embodiments of the present disclosure provides an integrated large screen that fits the shape of the center fascia 10 by using the stretchable display panel. Furthermore, a three-dimensional button display may be provided by the stretchable display panel. Therefore, a physical button, dial, and jog controller on the center fascia may be omitted, and the aesthetic effect of the vehicle's interior design may be improved. Furthermore, the convenience of operation and the stability of operation may be enhanced while the vehicle is being driven by implementing the three-dimensional button display including the stretchable display panel.

Moreover, the shape of the button display area of the stretchable display panel may be controlled to fit for user's environment by moving the guide member, thus improving a user's convenience when the display or the vehicle is controlled during driving.

Although example embodiments of the present disclosure have been described herein for illustrative purposes, those skilled in the art will appreciate that various modifications, additions, and substitutions are possible in these embodiments without departing from the scope and spirit of the present disclosure as defined in the accompanying claims and their equivalents.

What is claimed is:

1. A display device for a vehicle comprising:
   a stretchable display panel having a button display area and a display area adjacent the button display area, the stretchable display panel comprising a plurality of pixels continuously extending from the display area over the button display area, the button display area and the display area being integrally arranged on a center fascia of the vehicle having a plurality of curved surfaces, a step being defined between the button display area of the stretchable display panel and the adjacent display area of the stretchable display panel;
   a touch sensor on a first surface of the stretchable display panel and configured to sense a user's touch; and
   a pressure sensor on a second surface of the stretchable display panel opposite to the first surface.

2. The display device according to claim 1, wherein a display surface of the button display area protrudes above a display surface of the adjacent display area.

3. The display device according to claim 1, wherein a display surface of the button display area is depressed below a display surface of the adjacent display area.

4. The display device according to claim 1, wherein the button display area has a first area that is depressed below the adjacent display area and a second area that protrudes above the adjacent display area.

5. The display device according to claim 1, further comprising:
   a support member between the pressure sensor and the center fascia and supporting at least a portion of the stretchable display panel and the pressure sensor,
   wherein the pressure sensor overlaps the button display area, and
   wherein the pressure sensor is configured to detect a location at where pressure is applied and a magnitude of the applied pressure, the second surface being opposite to the first surface.

6. The display device according to claim 5, further comprising a haptic actuator between the pressure sensor and the support member or between the pressure sensor and the stretchable display panel, the haptic actuator being configured to vibrate in response to a change in a magnetic field.

7. The display device according to claim 5, wherein the pressure sensor comprises:
   a plurality of electrode layers stacked on each other in a vertical direction; and
   a plurality of piezoelectric layers between the electrode layers.

8. The display device according to claim 5, further comprising an insulator between the stretchable display panel and the pressure sensor.

9. The display device according to claim 8, wherein the insulator is on the second surface of the stretchable display panel and extends to a periphery of the button display area.

10. The display device according to claim 8, wherein the insulator comprises an organic material configured to reduce friction between the stretchable display panel and the support member.

11. The display device according to claim 5, further comprising an insulator between the pressure sensor and the support member and covering the support member.

12. The display device according to claim 11, wherein at least a portion of the insulator contacts the stretchable display panel at where the pressure sensor is not arranged.

13. The display device according to claim 1, further comprising:
   a guide member supporting the pressure sensor and being configured to shrink or extend the stretchable display panel; and a support member between the center fascia and the adjacent display area of the button display area of the stretchable display panel and supporting the adjacent display area, wherein the pressure sensor overlaps the button display area.

14. The display device according to claim 13, wherein the guide member is configured to move in a vertical direction to shrink or extend the button display area of the stretchable display panel such that the step between the button display area of the stretchable display panel and the adjacent display area is changed.

15. The display device according to claim 13, further comprising an insulator between the stretchable display panel and the pressure sensor.

16. The display device according to claim 1, wherein the stretchable display panel comprises:
   a first display area on a front of the center fascia;
   a second display area extending from the center fascia towards a driver's seat; and
   a third display area extending from the center fascia towards a passenger seat.

17. The display device according to claim 16, wherein the button display area is on a portion of at least one of the first, second, and third display areas.

18. The display device according to claim 16, wherein the stretchable display panel further comprises a fourth display area on a lower control pad extending from the center fascia.

19. The display device according to claim 1, wherein the stretchable display panel is configured to display audio-control information, air-conditioning-control information, and navigation information of the vehicle.

20. A display device for a vehicle comprising:
   a stretchable display panel having a button display area and a display area adjacent the button display area, the stretchable display panel comprising a plurality of pixels continuously extending from the display area over the button display area, the button display area and the display area having a continuous and fixed arrangement in a plan view and being integrally arranged on a center fascia of the vehicle having a plurality of curved surfaces, a step being defined between the button display area of the stretchable display panel and the adjacent display area of the stretchable display panel; and
   a touch sensor on a first surface of the stretchable display panel and configured to sense a user's touch.

* * * * *